United States Patent
Doornbos et al.

(10) Patent No.: US 9,871,101 B2
(45) Date of Patent: Jan. 16, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Gerben Doornbos, Leuven (BE); Chun-Hsiung Lin, Zhubei (TW); Chien-Hsun Wang, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/488,082

(22) Filed: Sep. 16, 2014

(65) Prior Publication Data

US 2016/0079358 A1    Mar. 17, 2016

(51) Int. Cl.

| | |
|---|---|
| *H01L 29/66* | (2006.01) |
| *H01L 29/06* | (2006.01) |
| *H01L 29/775* | (2006.01) |
| *H01L 29/423* | (2006.01) |
| *H01L 29/786* | (2006.01) |

(Continued)

(52) U.S. Cl.
CPC .......... *H01L 29/0673* (2013.01); *B82Y 10/00* (2013.01); *H01L 29/0676* (2013.01); *H01L 29/42376* (2013.01); *H01L 29/42392* (2013.01); *H01L 29/66439* (2013.01); *H01L 29/775* (2013.01); *H01L 29/78696* (2013.01); *H01L 21/823418* (2013.01); *H01L 29/66666* (2013.01)

(58) Field of Classification Search
CPC ............. H01L 29/0673; H01L 29/0669; H01L 29/66666; H01L 21/823487; H01L 21/823418
USPC ................. 438/212, 268; 257/329, E29.262, 257/E29.274
See application file for complete search history.

(56) References Cited

U.S. PATENT DOCUMENTS

2006/0216897 A1    9/2006    Lee et al.
2007/0228361 A1    10/2007    Raravikar et al.
(Continued)

FOREIGN PATENT DOCUMENTS

| KR | 10-0594327 B1 | 6/2006 |
|---|---|---|
| KR | 10-2008-0114777 A | 12/2008 |
| KR | 10-2014-0099306 A | 8/2014 |

OTHER PUBLICATIONS

G. Larrieu and X.-L. Han, "Vertical nanowire array-based field effect transistor for ultimate scaling" (Jan. 2013), Nanoscale, 2013, 5, 2437-2441.*
Tomioka et al. ("A III-V nanowire channel on silicon for high-performance vertical transistors", Nature, Aug. 9, 2012, vol. 488, pp. 189-193).*
J.J. Gu et al.; III-V Gate-all-around Nanowire MOSFET Process Technology: From 3D to 4D; pp. 23.7.1-23.7.4; 2012 IEEE.
K. Tomioka et al; Vertical In0.7Ga0.3 as nanowire surrounding-gate transistors with high-k gate dielectric on Si substrate; pp. 33.3.1-33.3.4; 2011 IEEE.
S. Bangsaruntip et al.; Density scaling with gate-all-around silicon nanowire MOSFETs for the 10 nm node and beyond; pp. 20.2.1-20-20.2.4; 2013 IEEE.
(Continued)

*Primary Examiner* — Kimberly Rizkallah
*Assistant Examiner* — Maria Ligai
(74) *Attorney, Agent, or Firm* — McDermott Will & Emery LLP

(57) ABSTRACT

A semiconductor structure, and methods for forming the semiconductor device are provided. In various embodiments, the semiconductor device includes a substrate, source/drain regions over the substrate, a plurality of nanowires over the substrate and sandwiched by the source/drain regions, a gate dielectric layer surrounding the plurality of nanowires, and a gate layer surrounding the gate dielectric layer.

20 Claims, 8 Drawing Sheets

(51) Int. Cl.
  *B82Y 10/00*     (2011.01)
  *H01L 21/8234*   (2006.01)

(56) References Cited

U.S. PATENT DOCUMENTS

| | | | |
|---|---|---|---|
| 2010/0102380 A1* | 4/2010 | Ohlsson | B82Y 10/00 257/329 |
| 2010/0295023 A1* | 11/2010 | Franklin | B82Y 10/00 257/24 |
| 2011/0233512 A1* | 9/2011 | Yang | B82Y 10/00 257/9 |
| 2014/0138623 A1 | 5/2014 | Franklin et al. | |
| 2014/0209855 A1 | 7/2014 | Cea et al. | |
| 2015/0053928 A1* | 2/2015 | Ching | H01L 21/823821 257/29 |

OTHER PUBLICATIONS

S.-G. Hur, et al.; A practical Si nanowire technology with nanowire-on-insulator structure for beyond 10nm logic technologies; pp. 26.5.1-26.5.4; 2013 IEEE).

Sung-Young Lee, et al.; A Novel Sub-50 nm Multi-Bridge-Channel MOSFET (MBCFET) with Extremely High Performance; pp. 200-201; 2004 IEEE Symposium on VLSI Technology Digest of Technical Papers.

T. Ernst, et al.; Novel 3D integration process for highly scalable Nano-Beam stacked-channels GAA (NBG) FinFETs with HfO2/TiN gate stack; 2006 IEDM.

* cited by examiner

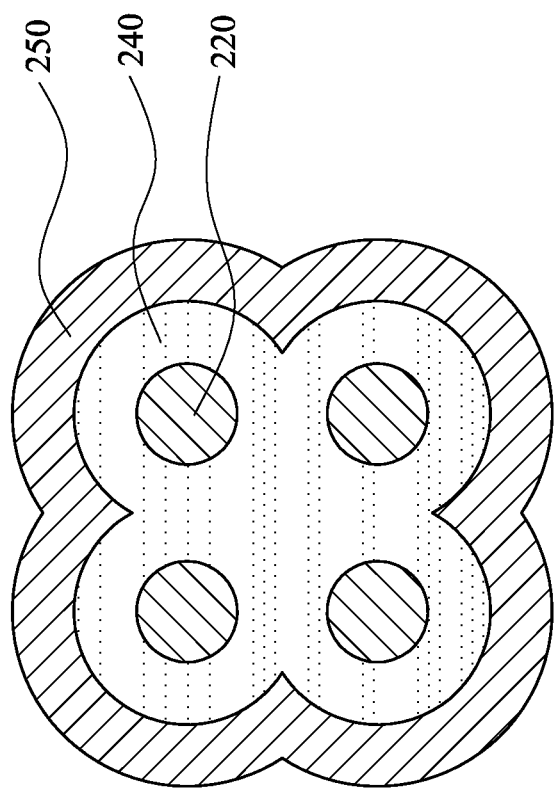

SEMICONDUCTOR DEVICE AND MANUFACTURING METHOD THEREOF

BACKGROUND

As the semiconductor industry has experienced rapid growth, many efforts have been made to integrate more devices within a substrate. The manufacturing of a field-effect transistor (FET) is focusing on the scaling down of the dimensions of the FET to improve the packing density of the semiconductor device. However, the classical planar transistor cannot achieve ultra-small dimensions due to physical constraints. Currently, various non-planar transistors, such as FinFET and gate-all-around (GAA) FET, are being developed. By now, the FinFET has entered manufacturing; the GAA FET is being considered as one of the next generation transistors owing to its good short-channel effect (SCE) control.

A nanowire FET is one of the GAA FET, which applies a plurality of semiconductor nanowires as channel regions between a source and a drain. The nanowire FET includes horizontal nanowire FET and vertical nanowire FET, in which the source-drain current flows in a direction parallel and perpendicular to the substrate surface, respectively. However, there are difficulties in improving the packing density of the semiconductor device because of the limitations in current manufacturing technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a top view of a portion of the semiconductor device in FIG. 2A.

DETAILED DESCRIPTION

Figure 1A:
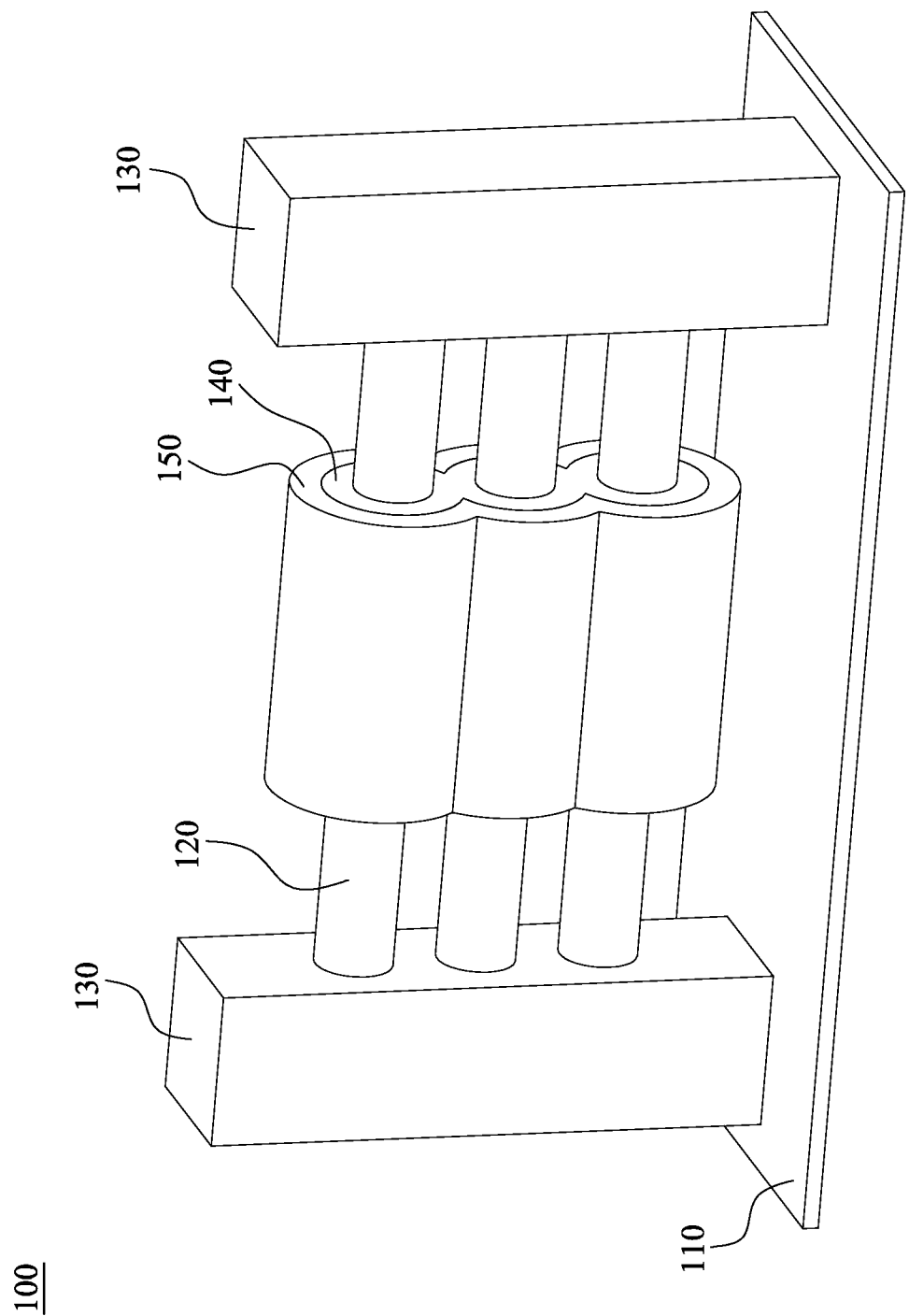
FIG. 1A is a schematic view of a semiconductor device in accordance with some embodiments in the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, either horizontal or vertical gate-all-around (GAA) nanowire FET has good short-channel effect control. The general nanowire FET uses perfect GAA control, which represents that each individual nanowire which comprises the general nanowire FET is perfectly surrounded by a gate dielectric layer and a gate layer. The nanowire pitch is the distance between the centers of two neighboring nanowires. The packing density of the nanowire FET is determined by the nanowire pitch, and reducing the nanowire pitch can improve the packing density. The nanowire pitch of general nanowire FET with perfect GAA control contains the diameter of the nanowire and twice the thickness of the gate dielectric layer and the gate layer. However, due to the limitations in current manufacturing technology, the thickness of the gate dielectric layer and the gate layer cannot be further scaled-down. Therefore, the packing density of the GAA nanowire FET is limited by the thickness of the gate dielectric layer and the gate layer. Therefore, general nanowire FET uses perfect GAA control resulting in good short-channel effect control at the expense of reduced nanowire packing density.

In order to solve the above-mentioned problems, the present disclosure provides a semiconductor device, which has improved packing density while still having good short-channel effect control and on-current ($I_{on}$).

FIG. 1A is a schematic view of a semiconductor device 100 in accordance with some embodiments in the present disclosure. The semiconductor device 100 includes a substrate 110, source/drain regions 130 over the substrate 110, a plurality of horizontal nanowires 120 over the substrate 110 and sandwiched by the source/drain regions 130, a gate dielectric layer 140 surrounding the plurality of horizontal nanowires 120, and a gate layer 150 surrounding the gate dielectric layer 140. The plural "horizontal nanowires" used in "the gate dielectric layer 140 surrounding the plurality of horizontal nanowires 120" represents that the gate dielectric layer 140 surrounds each of the horizontal nanowires 120 and is merged between two neighboring horizontal nanowires 120. Each of the individual horizontal nanowires 120 is not fully surrounded by the gate layer 150. In some embodiments of the present disclosure, the horizontal nanowires 120 are parallel to the substrate.

Figure 1B:
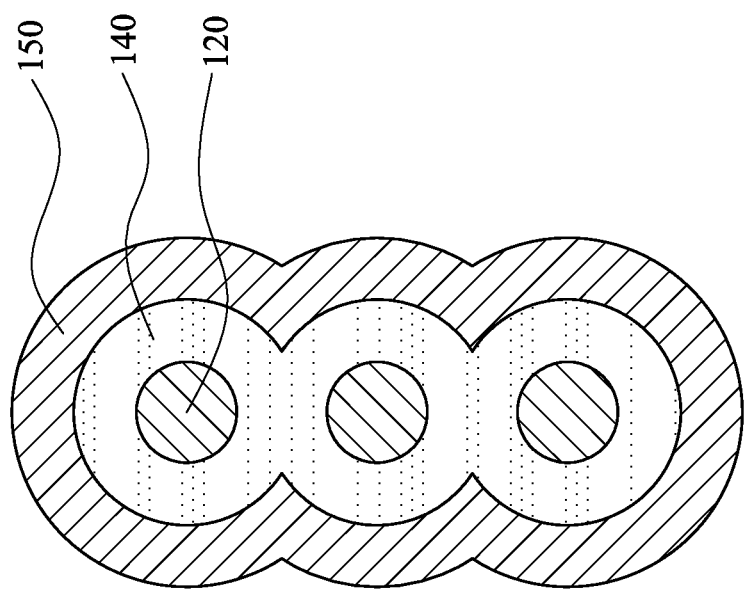
FIG. 1B is a side view of a portion of the semiconductor device in FIG. 1A.

Referring to FIG. 1B, which is a side view of the horizontal nanowires 120, the gate dielectric layer 140, and the gate layer 150 of the semiconductor device 100. In FIG. 1B, the horizontal nanowires 120 are surrounded by the gate dielectric layer 140, which means that the gate dielectric layer 140 between two neighboring horizontal nanowires 120 is merged.

In some embodiments of the present disclosure, the semiconductor device 100 is a horizontal nanowire field-effect transistor. The portions of the horizontal nanowires 120 surrounded by the gate dielectric layer 140 may serve as channel regions of the transistor.

In some embodiments in accordance with the present disclosure, the semiconductor device 100 has a source/drain doping concentration ($N_{s/d}$) between about $1 \times 10^{19}/cm^3$ and $2 \times 10^{20}/cm^3$.

The material of the substrate 110 may be any nonconductive material or highly resistive semiconductor material. Examples of the material of the substrate 110 include but are not limited to aluminum oxide, magnesium oxide, zinc oxide, silicon dioxide, silicon nitride, silicon, silicon carbide, glass, and a combination thereof.

In some embodiments of the present disclosure, the horizontal nanowires 120 have a <110> crystal orientation.

In some embodiments of the present disclosure, the horizontal nanowires 120 are arranged in an $n_1 \times n_2$ array, wherein $n_1$ is 1 or 2, and $n_2$ is an integer greater than 1. In FIGS. 1A and 1B, the horizontal nanowires 120 of the semiconductor device 100 are arranged in an 1×3 array, i.e. $n_1$ is 1 and $n_2$ is 3.

In some embodiments of the present disclosure, the horizontal nanowires 120 are vertically stacked as shown in FIG. 1A. In other embodiments of the present disclosure, the horizontal nanowires may be horizontally aligned.

The material of the horizontal nanowires 120 may be any suitable material. Examples of the material of the horizontal nanowires 120 include Si, Ge, SiGe, InAs, GaSb, InGaAs, InGaSb, and combinations thereof.

In some embodiments in accordance with the present disclosure, the horizontal nanowires 120 have a diameter in the range from about 5 nm to 15 nm.

In some embodiments in accordance with the present disclosure, the gate dielectric layer 140 is a high-k dielectric layer. As used herein, the term "high-k dielectric" refers to the material having a dielectric constant, k, greater than about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, SiN, a silicate thereof, and an alloy thereof. Each value of x is independently from 0.5 to 3, and each value of y is independently from 0 to 2. In some embodiments in accordance with the present disclosure, the material of the high-k dielectric layer is $Al_2O_3$, $HfO_2$, $ZrO_2$, or combinations thereof. In other embodiments in accordance with the present disclosure, the material of the high-k dielectric layer is $HfO_2$.

In some embodiments in accordance with the present disclosure, the high-k dielectric layer has a thickness in the range from about 4 nm to 8 nm. In other embodiments in accordance with the present disclosure, the high-k dielectric layer has a thickness of 5 nm.

In some embodiments in accordance with the present disclosure, the gate layer 150 is a metal gate layer. The material of the metal gate layer may be any suitable material. Examples of the material of the metal gate layer include but are not limited to tungsten (W), titanium (Ti), tantalum (Ta), aluminum (Al), nickel (Ni), ruthenium (Ru), palladium (Pd), platinum (Pt), tungsten nitride ($WN_x$), titanium nitride (TiN), tantalum nitride (TaN), aluminum nitride (AlN), tungsten silicide ($WSi_x$), nickel silicide ($Ni_2Si$), titanium silicide ($TiSi_2$), titanium aluminide (TiAl), an alloy thereof, and combinations thereof.

Figure 2A:
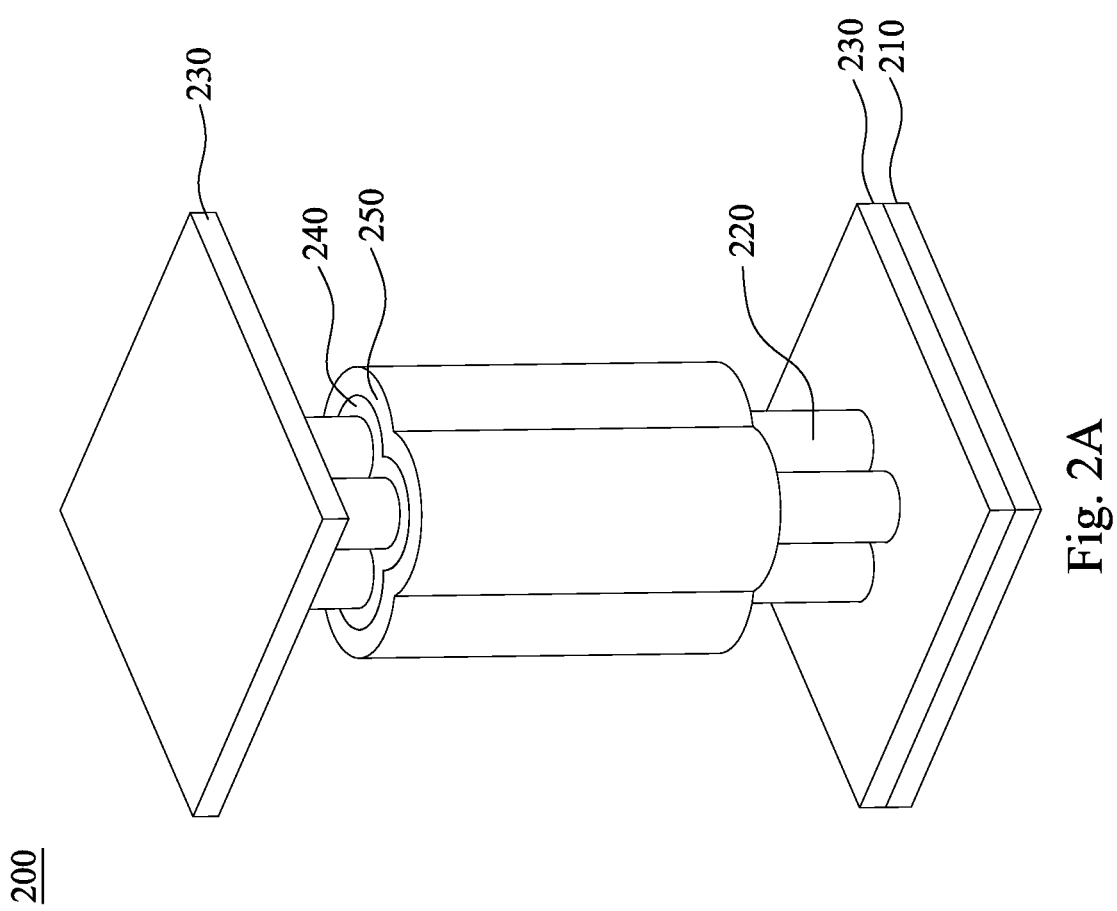
FIG. 2A is a schematic view of another semiconductor device in accordance with some embodiments in the present disclosure.

FIG. 2A is a schematic view of a semiconductor device 200 in accordance with some embodiments in the present disclosure. The semiconductor device 200 includes a substrate 210, source/drain regions 230 over the substrate 210, a plurality of protruding nanowires 220 from the substrate 210 and sandwiched by the source/drain regions 230, a gate dielectric layer 240 surrounding the plurality of protruding nanowires 220, and a gate layer 250 surrounding the gate dielectric layer 240. The plural "protruding nanowires" used in "the gate dielectric layer 240 surrounding the plurality of protruding nanowires 220" represents that the gate dielectric layer 240 surrounds each of the protruding nanowires 220 and is merged between two neighboring protruding nanowires 220. Each of the individual protruding nanowires 220 is not fully surrounded by the gate layer 250. In some embodiments of the present disclosure, the protruding nanowires 220 from the substrate 210 are vertical nanowires over the substrate.

Referring to FIG. 2B, which is a top view of the protruding nanowires 220, the gate dielectric layer 240, and the gate layer 250 of the semiconductor device 200. In FIG. 2B, the protruding nanowires 220 are surrounded by the gate dielectric layer 240, which means that the gate dielectric layer 240 between two neighboring protruding nanowires 220 is merged.

In some embodiments of the present disclosure, the semiconductor device 200 is a vertical nanowire field-effect transistor. The portions of the protruding nanowires 220 surrounded by the gate dielectric layer 240 may serve as channel regions of the transistor.

In some embodiments in accordance with the present disclosure, the semiconductor device 200 has a source/drain doping concentration ($N_{s/d}$) between about $1 \times 10^{19}/cm^3$ and $2 \times 10^{20}/cm^3$.

The material of the substrate 210 may be any nonconductive or highly resistive semiconductor material. Examples of the material of the substrate 210 include but are not limited to aluminum oxide, magnesium oxide, zinc oxide, silicon dioxide, silicon nitride, silicon, silicon carbide, glass, and a combination thereof.

The semiconductor device is a nanowire field-effect transistor having the nanowires protruding from the substrate. In some embodiments of the present disclosure, the protruding nanowires are vertical nanowires over the substrate.

In some embodiments of the present disclosure, the protruding nanowires 220 have a <100> or <111> crystal orientation.

In some embodiments of the present disclosure, the protruding nanowires 220 are arranged in an $n_3 \times n_4$ array, wherein $n_3$ is 1 or 2, and $n_4$ is an integer greater than 1. In FIGS. 2A and 2B, the protruding nanowires 220 of the semiconductor device 200 are arranged in a 2×2 array, i.e. both $n_3$ and $n_4$ are 2.

The protruding nanowires may be arranged on a grid of any suitable shape. In FIGS. 2A and 2B, the protruding nanowires 220 of the semiconductor device 200 are arranged on a square grid. In other embodiments of the present disclosure, the protruding nanowires are arranged on a triangular or rectangular grid.

Figure 3A:
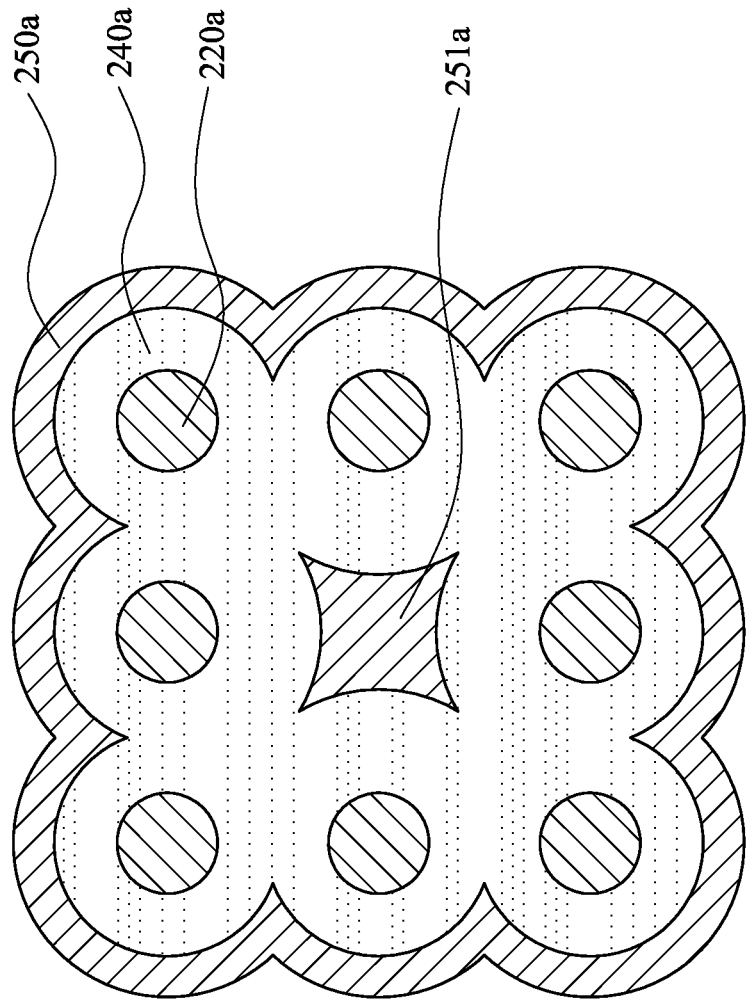
FIGS. 3A through 3C are top views of a portion of semiconductor devices in accordance with some embodiments in the present disclosure.

Referring to FIG. 3A, which is a top view of protruding nanowires 220a, a gate dielectric layer 240a, and gate layers 250a and 251a of a semiconductor device in accordance with other embodiments in the present disclosure. The eight protruding nanowires 220a are arranged in on a square grid, and surrounded by the gate dielectric layer 240a, which is merged between two neighboring protruding nanowires 220a. The gate dielectric layer 240a is surrounded by the gate layers 250a and 251a, and the center of the rectangle is filled up with the gate layer 251a. Because at least a portion of the gate dielectric layer 240a that surrounds each protruding nanowire 220a is surrounded by the gate layers 250a and 251a, each of the eight protruding nanowires 220a may still serve as the channel region of the semiconductor device.

Figure 3C:
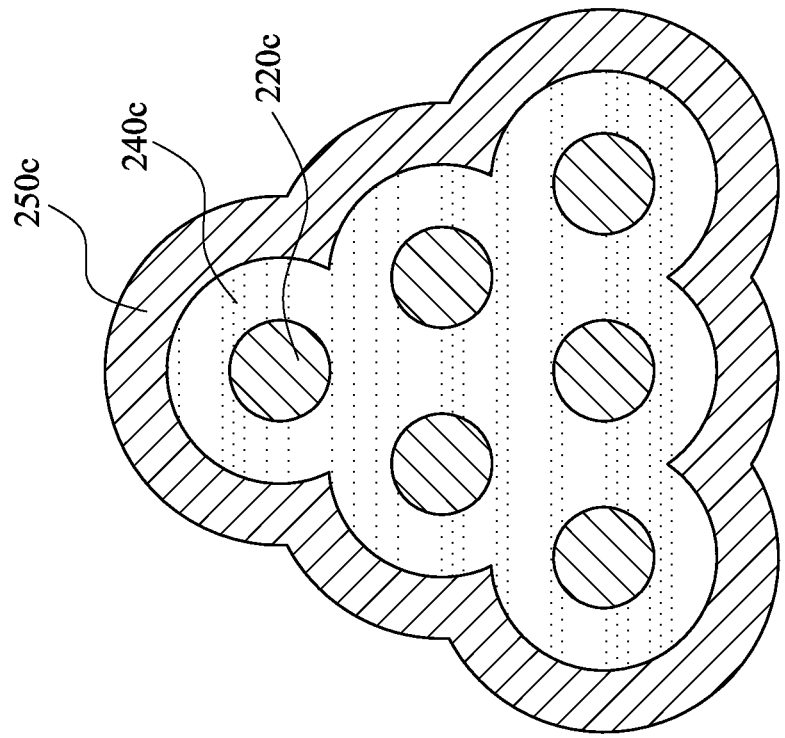
Figure 3B:
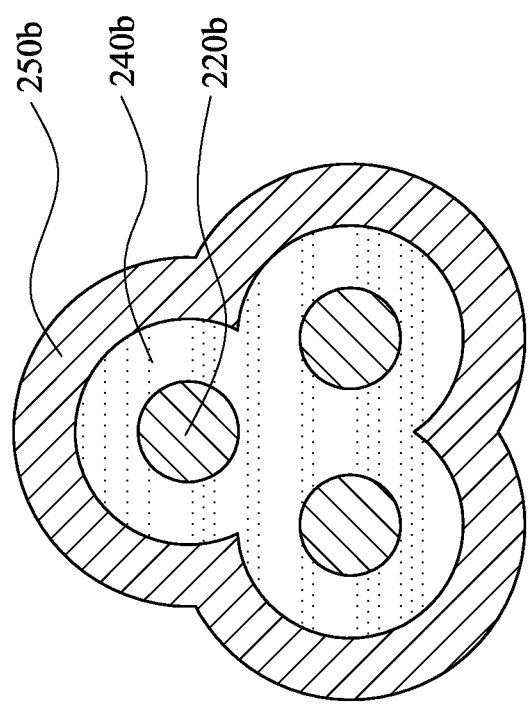

Referring to FIG. 3B, which is a top view of protruding nanowires 220b, a gate dielectric layer 240b, and a gate layer 250b of a semiconductor device in accordance with other embodiments in the present disclosure. The three protruding nanowires 220b are arranged on a triangular grid, and surrounded by the gate dielectric layer 240b, which is merged between two neighboring protruding nanowires 220b. The gate dielectric layer 240b is surrounded by the gate layer 250b.

Referring to FIG. 3C, which is a top view of protruding nanowires 220c, a gate dielectric layer 240c, and a gate layer 250c of a semiconductor device in accordance with yet other embodiments in the present disclosure. The six protruding nanowires 220c are arranged on a triangular grid, and surrounded by the gate dielectric layer 240c, which is merged between two neighboring protruding nanowires 220c. The gate dielectric layer 240c is surrounded by the gate layer 250c.

The material of the protruding nanowires 220/220a/220b/220c may be any suitable material. Examples of the material of the protruding nanowires 220/220a/220b/220c include Si, Ge, SiGe, InAs, GaSb, InGaAs, InGaSb, and combinations thereof.

In some embodiments in accordance with the present disclosure, the protruding nanowires 220/220a/220b/220c have a diameter in the range from about 5 nm to 15 nm.

In some embodiments in accordance with the present disclosure, the gate dielectric layer 240/240a/240b/240c is a high-k dielectric layer. As used herein, the term "high-k dielectric" refers to the material having a dielectric constant, k, greater than about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2. In some embodiments in accordance with the present disclosure, the material of the high-k dielectric layer is $Al_2O_3$, $HfO_2$, $ZrO_2$, or combinations thereof. In other embodiments in accordance with the present disclosure, the material of the high-k dielectric layer is $HfO_2$.

In some embodiments in accordance with the present disclosure, the high-k dielectric layer has a thickness in the range from about 4 nm to 8 nm. In other embodiments in accordance with the present disclosure, the high-k dielectric layer has a thickness of 5 nm.

In some embodiments in accordance with the present disclosure, the gate layer 250/250a/251a/250b/250c is a metal gate layer. The material of the metal gate layer may be any suitable material. Examples of the material of the metal gate layer include but are not limited to tungsten (W), titanium (Ti), tantalum (Ta), aluminum (Al), nickel (Ni), ruthenium (Ru), palladium (Pd), platinum (Pt), tungsten nitride ($WN_x$), titanium nitride (TiN), tantalum nitride (TaN), aluminum nitride (AlN), tungsten silicide ($WSi_x$), nickel silicide ($Ni_2Si$), titanium silicide ($TiSi_2$), titanium aluminide (TiAl), an alloy thereof, and combinations thereof.

It is noteworthy that the semiconductor device of the present disclosure is without perfect GAA control, which represents that each nanowire (including horizontal nanowire and protruding nanowire) is not perfectly surrounded by a gate dielectric layer and a gate layer. The nanowires of the present disclosure are surrounded by the gate dielectric layer, which is merged between two neighboring nanowires. The nanowire pitch of the semiconductor device of the present disclosure contains the diameter of the nanowire and about twice the thickness of the gate dielectric layer. Comparing to the general semiconductor device with perfect control, in which the nanowire pitch contains the diameter of the nanowire and twice the thickness of the gate dielectric layer and the gate layer, the nanowire pitch of the semiconductor device of the present disclosure is without the thickness of the gate layer. In addition, at least a portion of the gate dielectric layer that surrounds each nanowire in the present disclosure is surrounded by the gate layer, and thus each nanowire may still serve as the channel region of the semiconductor device. Therefore, the nanowire pitch of the semiconductor device of the present disclosure may be scaled-down, and thus the packing density of the semiconductor device is improved, while still having good short-channel control and on-current ($I_{on}$).

Figure 4:
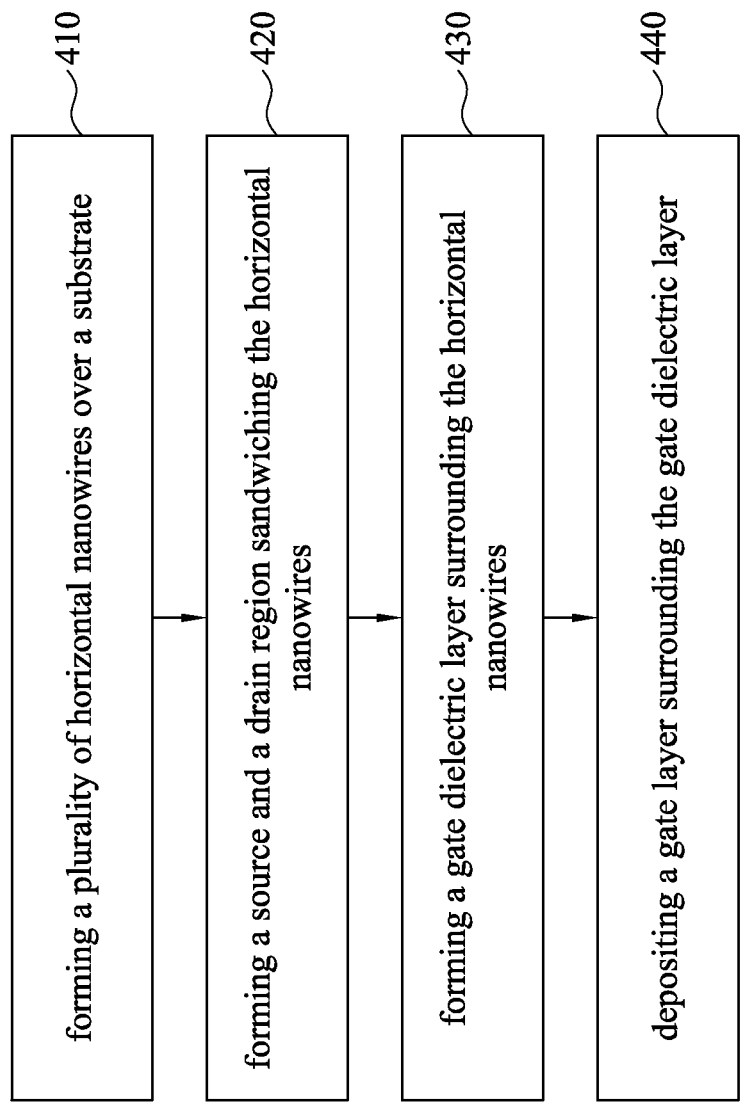
FIG. 4 is a flow chart illustrating a method for manufacturing a semiconductor device in accordance with some embodiments of the present disclosure.

FIG. 4 shows a flowchart illustrating a method for forming a semiconductor device according to various embodiments of the present disclosure. In some embodiments of the present disclosure, the semiconductor device formed by the method shown in FIG. 4 is a horizontal nanowire field-effect transistor.

The method shown in FIG. 4 begins with block 410 in which a plurality of horizontal nanowires are formed over a substrate. In some embodiments of the present disclosure, the horizontal nanowires are parallel to the substrate.

The horizontal nanowires may be formed by any suitable technique. In some embodiments of the present disclosure, the horizontal nanowires are formed by forming a stack structure over the substrate, and the stack structure includes a plurality of layers of nanowire material and a plurality of interlayers deposited between each two layers of nanowire material. The stack layer is etched to form a nanowire portion. The interlayers are removed from the nanowire portion to form the horizontal nanowires. The horizontal nanowires formed by this technique are vertically stacked. In other embodiments of the present disclosure, the stack structure includes a plurality of interlayers and a plurality of layers of nanowire material deposited between each two interlayers.

The method shown in FIG. 4 continues with block 420 in which a source and a drain region are formed sandwiching the horizontal nanowires. The source region and the drain region are connected by the horizontal nanowires. The source and the drain region may be formed by doping.

The method shown in FIG. 4 further includes forming a gate dielectric layer surrounding the horizontal nanowires as shown in block 430. The gate dielectric layer is merged between two neighboring horizontal nanowires.

The gate dielectric layer may be a high-k dielectric layer, and may be formed by any suitable technique, such as deposition, thermal oxidation, thermal nitridation, and thermal oxynitridation. Examples of the deposition include but are not limited to chemical vapor deposition (CVD), atmospheric pressure CVD (APCVD), low pressure CVD (LP- CVD), plasma enhanced CVD (PECVD), metal-organic CVD (MOCVD), atomic layer deposition (ALD), chemical solution deposition, sputtering, spin-on coating, and epitaxy. In some embodiments of the present disclosure, the high-k dielectric layer is formed by an ALD process.

The method shown in FIG. 4 continues with block 440 in which a gate layer is deposited to surround the gate dielectric layer.

The gate layer may be a metal gate layer, and may be formed by any suitable technique, such as deposition. Examples of the deposition include but are not limited to chemical vapor deposition (CVD), plasma enhanced chemical vapor deposition (PECVD), physical vapor deposition (PVD), sputtering, and atomic layer deposition (ALD).

It is noteworthy that the foregoing operating sequences for the method for forming the semiconductor device shown in FIG. 4 are merely examples and are not intended to be limiting, and various changes, substitutions, and alterations may be made without departing from the spirit and scope of the present disclosure.

In some embodiments of the present disclosure, the source/drain regions are formed. Next, the horizontal nanowires are formed. Then, the gate dielectric layer, and the gate layer are formed.

In other embodiments of the present disclosure, the horizontal nanowires are formed. Next, the source/drain regions are formed. Then, the gate dielectric layer, and the gate layer are formed.

In yet other embodiments of the present disclosure, the horizontal nanowires are formed. Next, the gate dielectric layer, and the gate layer are formed. Then, the source/drain regions are formed.

Figure 5:
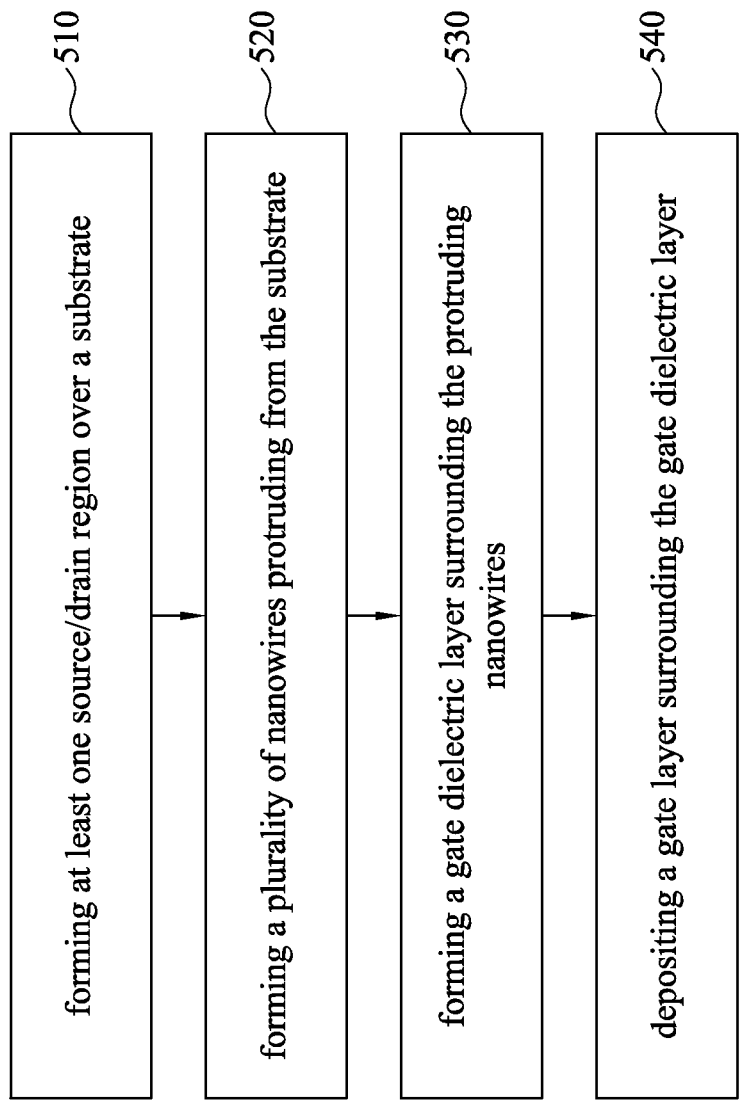
FIG. 5 is a flow chart illustrating a method for manufacturing a semiconductor device in accordance with some embodiments of the present disclosure.

FIG. 5 shows a flowchart illustrating a method for forming a semiconductor device according to various embodiments of the present disclosure. In some embodiments of the present disclosure, the semiconductor device formed by the method shown in FIG. 5 is a vertical nanowire field-effect transistor.

The method shown in FIG. 5 begins with block 510 in which at least one source/drain region is formed over a substrate. The source/drain region may be formed by doping. The term "source/drain region" used herein may represent source region or drain region.

The method shown in FIG. 5 continues with block 520 in which a plurality of nanowires are formed protruding from the substrate. The nanowires are protruding from the source/drain region and the substrate. In some embodiments of the present disclosure, the protruding nanowires are vertical to the source/drain region and the substrate.

The protruding nanowires may be formed by any suitable process.

In some embodiments of the present disclosure, the protruding nanowires may be formed by forming a layer of nanowire material over the substrate. Then, the nanowire material is etched to form the protruding nanowires on the predetermined areas. The layer of nanowire material may be formed by deposition or epitaxy.

In other embodiments of the present disclosure, the protruding nanowires may be formed by forming a sacrificial layer over the substrate. Then, the sacrificial layer is etched to form vias on the predetermined areas. The vias are filled with nanowire material. The remaining sacrificial layer is removed to form the protruding nanowires. The vias may be filled by any suitable technique, such as deposition and plating, such as electroplating.

In yet other embodiments of the present disclosure, the protruding nanowires may be formed by applying a plurality of nanowire seed materials over a plurality of determined areas, and growing the protruding nanowires, wherein the growing conditions depend on the nanowire material used. The protruding nanowires may have a <111> crystal orientation. The material of the nanowire seed may be Au. The material of the protruding nanowires may be InAs, GaSb, or combinations thereof.

The method shown in FIG. 5 further includes forming a gate dielectric layer surrounding the protruding nanowires as shown in block 530. The gate dielectric layer is merged between two neighboring protruding nanowires.

The gate dielectric layer may be a high-k dielectric layer. The high-k dielectric layer may be formed by any suitable technique, such as deposition, thermal oxidation, thermal nitridation, and thermal oxynitridation. Examples of the deposition include but are not limited to chemical vapor deposition (CVD), atmospheric pressure CVD (APCVD), low pressure CVD (LPCVD), plasma enhanced CVD (PECVD), metal-organic CVD (MOCVD), atomic layer deposition (ALD), chemical solution deposition, sputtering, spin-on coating, and epitaxy. In some embodiments of the present disclosure, the high-k dielectric layer is formed by an ALD process.

The method shown in FIG. 5 continues with block 540 in which a gate layer is deposited to surround the gate dielectric layer.

The gate layer may be a metal gate layer, and may be formed by any suitable technique, such as deposition. Examples of the deposition include but are not limited to chemical vapor deposition (CVD), plasma enhanced chemical vapor deposition (PECVD), physical vapor deposition (PVD), sputtering, and atomic layer deposition (ALD).

It is noteworthy that the foregoing operating sequences for the method for forming the semiconductor device shown in FIG. 5 are merely examples and are not intended to be limiting, and various changes, substitutions, and alterations may be made without departing from the spirit and scope of the present disclosure.

In some embodiments of the present disclosure, the source region and the drain region are formed. Next, the protruding nanowires are formed. Then, the gate dielectric layer, and the gate layer are formed.

In other embodiments of the present disclosure, one source/drain region is formed. Next, the protruding nanowires are formed. The gate dielectric layer, and the gate layer are formed. Then, another source/drain region is formed.

In yet other embodiments of the present disclosure, the protruding nanowires are formed. Next, the gate dielectric layer, and the gate layer are formed. Then, the source region and the drain regions are formed.

It is noteworthy that the semiconductor device formed by the method in accordance with the present disclosure (including the methods shown in FIGS. 4 and 5) is without perfect GAA control. The gate dielectric layer of the present disclosure is formed to surround the nanowires, and merges between two neighboring nanowires. The nanowire pitch of the semiconductor device formed by the method in accordance with the present disclosure may be scaled-down, and thus the packing density of the semiconductor device is improved, while still having good short-channel control and on-current ($I_{on}$).

The embodiments of the present disclosure discussed above have advantages over exiting methods and systems. The semiconductor device of the present disclosure is without perfect GAA control. Because the gate dielectric layer surrounds the nanowires, in which the gate dielectric layer is merged between two neighboring nanowires, the pitch of the nanowire can be scaled-down. In addition, each nanowire of the present disclosure may still serve as the channel region of the semiconductor device because at least a portion of the gate dielectric layer that surrounds each nanowire is surrounded by the gate layer. Therefore, the packing density of the semiconductor device is increased while it still has good short-channel effect control and on-current ($I_{on}$). It is understood, however, that other embodiments may have different advantages, and that no particular advantages is required for all embodiments.

In accordance with some embodiments of the present disclosure, a semiconductor device includes a substrate, source/drain regions over the substrate, a plurality of nanowires over the substrate and sandwiched by the source/drain regions, a gate dielectric layer surrounding the plurality of nanowires, and a gate layer surrounding the gate dielectric layer.

In accordance with other embodiments of the present disclosure, a method for forming a semiconductor device includes forming a plurality of horizontal nanowires over a substrate. A source and a drain region are formed sandwiching the horizontal nanowires. A gate dielectric layer is formed to surround the horizontal nanowires. A gate layer is deposited to surround the gate dielectric layer.

In accordance with yet other embodiments of the present disclosure, a method for forming a semiconductor device includes forming at least one source/drain region over a substrate. A plurality of protruding nanowires are formed over the substrate. A gate dielectric layer is formed to surround the horizontal nanowires. A gate layer is deposited to surround the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a substrate;
 source/drain regions over the substrate;
 a plurality of nanowires over the substrate and sandwiched by the source/drain regions;
 a gate dielectric layer surrounding the plurality of nanowires, wherein the gate dielectric layer is merged among neighboring nanowires and has a collective curved sidewall surrounding the plurality of nanowires; and
 a gate layer conformingly disposed on the gate dielectric layer.

2. The semiconductor device of claim 1, wherein the nanowires are protruding from the substrate.

3. The semiconductor device of claim 2, wherein the nanowires have a <100> or <111> crystal orientation.

4. The semiconductor device of claim 2, wherein the nanowires are arranged in an $n_3 \times n_4$ array, and $n_3$ is 1 or 2, $n_4$ is an integer greater than 1.

5. The semiconductor device of claim 4, wherein $n_3$ is 2, and $n_4$ is 2.

6. The semiconductor device of claim 2, wherein the nanowires are arranged on a square, a rectangular or a triangular grid.

7. The semiconductor device of claim 2, wherein the nanowires are vertical nanowires.

8. The semiconductor device of claim 1, wherein the material of the nanowires comprises Si, Ge, SiGe, InAs, GaSb, InGaAs, InGaSb, or combinations thereof.

9. The semiconductor device of claim 1, wherein the nanowires have a diameter in the range from about 5 nm to 15 nm.

10. The semiconductor device of claim 1, wherein the gate dielectric layer is a high-k dielectric layer.

11. The semiconductor device of claim 10, wherein the high-k dielectric layer has a thickness in the range from about 4 nm to 8 nm.

12. The semiconductor device of claim 11, wherein the high-k dielectric layer has a thickness of 5 nm.

13. The semiconductor device of claim 10, wherein the high-k dielectric layer is made of $Al_2O_3$, $HfO_2$, $ZrO_2$, or combinations thereof.

14. The semiconductor device of claim 1, wherein the substrate is made of aluminum oxide, magnesium oxide, zinc oxide, silicon dioxide, silicon nitride, silicon, silicon carbide, glass, or a combination thereof.

15. The semiconductor device of claim 1, wherein a portion of the gate dielectric layer surrounding the each nanowire is surrounded by the gate layer.

16. The semiconductor device of claim 1, wherein the gate layer is a metal gate layer.

17. The semiconductor device of claim 16, wherein the metal gate layer is made of tungsten, titanium, tantalum, aluminum, nickel, ruthenium, palladium, platinum, tungsten nitride, titanium nitride, tantalum nitride, aluminum nitride, tungsten silicide, nickel silicide, titanium silicide, titanium aluminide, an alloy thereof, or combinations thereof.

18. The semiconductor device of claim 1, wherein the semiconductor device has a nanowire pitch substantially equal to the sum of the diameter of the nanowires and twice the thickness of the gate dielectric layer.

19. The semiconductor device of claim 1, wherein the semiconductor device has a source/drain doping concentration between about $1 \times 10^9/cm^3$ and $2 \times 10^{20}/cm^3$.

20. The semiconductor of claim 1, wherein the gate layer is disposed along the collective curved sidewall of the gate dielectric layer.

* * * * *